(12) United States Patent
Mallikarjunaswamy

(10) Patent No.: US 10,020,369 B2
(45) Date of Patent: *Jul. 10, 2018

(54) DUAL CHANNEL TRENCH LDMOS TRANSISTORS WITH DRAIN SUPERJUNCTION STRUCTURE INTEGRATED THEREWITH

(71) Applicant: Alpha and Omega Semiconductor Incorporated, Sunnyvale, CA (US)

(72) Inventor: Shekar Mallikarjunaswamy, San Jose, CA (US)

(73) Assignee: Alpha and Omega Semiconductor Incorporation, Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/422,340

(22) Filed: Feb. 1, 2017

(65) Prior Publication Data

US 2017/0213894 A1 Jul. 27, 2017

Related U.S. Application Data

(60) Continuation of application No. 14/880,982, filed on Oct. 12, 2015, now Pat. No. 9,595,517, which is a (Continued)

(51) Int. Cl.
*H01L 29/76* (2006.01)
*H01L 29/94* (2006.01)
(Continued)

(52) U.S. Cl.
CPC ........ *H01L 29/407* (2013.01); *H01L 29/0634* (2013.01); *H01L 29/1095* (2013.01); *H01L 29/408* (2013.01); *H01L 29/7816* (2013.01)

(58) Field of Classification Search
CPC ............. H01L 29/4236; H01L 29/7802; H01L 29/0649; H01L 29/42356
(Continued)

(56) References Cited

U.S. PATENT DOCUMENTS 5,541,440 A 7/1996 Kozai
5,646,063 A 7/1997 Mehta
(Continued)

FOREIGN PATENT DOCUMENTS

EP 1703566 9/2006
WO WO2005065385 7/2005

OTHER PUBLICATIONS

Christoph Kadow et al., "Fabrication of Trench Isolation and Trench Power MOSFETs in a Smart Power IC Technology with a Single Trench Unit Process," ©2009 IEEE, pp. 224-226.
(Continued)

*Primary Examiner* — Theresa T Doan
(74) *Attorney, Agent, or Firm* — Innovation Counsel LLP

(57) ABSTRACT

A dual channel trench LDMOS transistor includes a semiconductor layer of a first conductivity type formed on a substrate; a first trench formed in the semiconductor layer where a trench gate is formed in an upper portion of the first trench; a body region of the second conductivity type formed in the semiconductor layer adjacent the first trench; a source region of the first conductivity type formed in the body region and adjacent the first trench; a planar gate overlying the body region; a drain drift region of the first conductivity type formed in the semiconductor layer and in electrical contact with a drain electrode; and alternating N-type and P-type regions formed in the drain drift region with higher doping concentration than the drain-drift regions to form a super-junction structure in the drain drift region.

22 Claims, 9 Drawing Sheets

Related U.S. Application Data continuation of application No. 14/196,286, filed on Mar. 4, 2014, now Pat. No. 9,190,408, which is a continuation of application No. 13/738,915, filed on Jan. 10, 2013, now Pat. No. 8,704,303, which is a continuation of application No. 13/440,929, filed on Apr. 5, 2012, now Pat. No. 8,378,420, which is a division of application No. 12/629,844, filed on Dec. 2, 2009, now Pat. No. 8,174,070.

(51) Int. Cl.
*H01L 29/40* (2006.01)
*H01L 29/78* (2006.01)
*H01L 29/10* (2006.01)
*H01L 29/06* (2006.01)

(58) Field of Classification Search
USPC ................. 257/331, 335, 341–342
See application file for complete search history.

(56) References Cited

U.S. PATENT DOCUMENTS

| | | |
|---|---|---|
| 6,903,421 B1 | 6/2005 | Huang |
| 6,972,471 B2 | 12/2005 | Yang |
| 7,015,115 B1 | 3/2006 | Yin |
| 7,087,491 B1 | 8/2006 | Husher |
| 7,154,159 B2 | 12/2006 | Cheng |
| 7,242,070 B2 | 7/2007 | Yang |
| 7,291,541 B1 | 11/2007 | Foote |
| 7,453,119 B2 | 11/2008 | Bhalla |
| 7,468,307 B2 | 12/2008 | Hartner |
| 8,174,070 B2 * | 5/2012 | Mallikarjunaswamy ............ H01L 21/823807 257/331 |
| 8,378,420 B2 | 2/2013 | Mallikarjunaswamy |
| 8,704,303 B2 | 4/2014 | Mallikarjunaswamy |
| 9,190,408 B2 | 11/2015 | Mallikarjunaswamy |
| 9,595,517 B2 | 3/2017 | Mallikarjunaswamy |
| 2005/0167742 A1 | 8/2005 | Challa |
| 2006/0038224 A1 | 2/2006 | Shibib |
| 2008/0197408 A1 | 8/2008 | Disney |
| 2010/0078715 A1 | 4/2010 | Lee |
| 2011/0127602 A1 | 6/2011 | Mallikarjunaswamy |

OTHER PUBLICATIONS

F. De Pestel et al., "Deep Trench Isolation for a 50V 0.35 1um Based Smart Power Technology,"Technology Research & Development, AMI Semiconductor Belgium BVBA, 4 pages.

Koji Shirai et al., "Ultra-low On-Resistance LDMOS Implementation in 0.133um CD and BiCD Process Technologies for Analog Power IC's," ©2009 IEEE, pp. 77-79.

MD Mash-Hud Iqbal et al., "On the Static Performance of the RESURF LDMOSFETs for Power ICs," ©2009 IEEE, pp. 247-250.

Namkyu Park et al., "aBCD18n advanced 0.18 1um BCD Technology for PMIC Application," ©2009 IEEE, pp. 231-234.

Tahir Khan et al., "Combined Lateral Vertical RESURF (CLAVER) LDMOS structure," ©2009 IEEE, pp. 1-16.

V. Parthasarathy et al., "A 0.25um based 70V smart power technology with deep trench for high-voltage isolation," ©2009 IEEE, pp. 459-462.

\* cited by examiner

DUAL CHANNEL TRENCH LDMOS TRANSISTORS WITH DRAIN SUPERJUNCTION STRUCTURE INTEGRATED THEREWITH

CROSS REFERENCE TO OTHER APPLICATIONS

This application is a continuation of U.S. patent application Ser. No. 14/880,982, entitled SEMICONDUCTOR DEVICE EMPLOYING TRENCHES FOR ACTIVE GATE AND ISOLATION, filed Oct. 12, 2015, now U.S. Pat. No. 9,595,517, which is a continuation of U.S. patent application Ser. No. 14/196,286, entitled SEMICONDUCTOR DEVICE EMPLOYING TRENCHES FOR ACTIVE GATE AND ISOLATION, filed Mar. 4, 2014, now U.S. Pat. No. 9,190,408, which is a continuation of U.S. patent application Ser. No. 13/738,915, entitled DUAL CHANNEL TRENCH LDMOS TRANSISTORS AND TRANSISTORS INTEGRATED THEREWITH, filed Jan. 10, 2013, now U.S. Pat. No. 8,704,303, which is a continuation of U.S. patent application Ser. No. 13/440,929, entitled VERTICAL TRENCH LDMOS TRANSISTOR, filed Apr. 5, 2012, now U.S. Pat. No. 8,378,420, which is a divisional of U.S. patent application Ser. No. 12/629,844, entitled DUAL CHANNEL TRENCH LDMOS TRANSISTORS AND BCD PROCESS WITH DEEP TRENCH ISOLATION, filed Dec. 2, 2009, now U.S. Pat. No. 8,174,070, which patents and patent applications are incorporated herein by reference for all purposes.

FIELD OF THE INVENTION

The invention relates to high voltage semiconductor devices and the manufacturing process thereof and, in particular, to a LDMOS transistor having a planar channel and a trench channel and to trench isolation in a BCD (Bipolar CMOS and DMOS) fabrication process.

DESCRIPTION OF THE RELATED ART

Lateral double-diffused metal-oxide-semiconductor (LDMOS) transistors are commonly used in high-voltage applications (20 to 500 volts) because of their high breakdown voltage characteristics and compatibility with CMOS technology for low voltage devices. In general, an LDMOS transistor includes a polysilicon gate, an N+ source region formed in a P-type body region, and an N+ drain region. The N+ drain region is separated from the channel formed in the body region under the polysilicon gate by an N drift region. It is well known that by increasing the length of the N drift region, the breakdown voltage of the LDMOS transistor can be accordingly increased.

Bipolar-CMOS-DMOS (BCD) process technologies refer to semiconductor fabrication processes that incorporate bipolar, complementary MOS (CMOS) and DMOS devices into a single fabrication process flow. In general, bipolar devices are used for analog circuitry, CMOS devices are used for digital circuitry and DMOS devices are used for handling high voltage and current demands for managing on-chip or system power. Thus, BCD processes are often used for manufacturing high voltage mixed signal integrated circuits or analog system-on-chip applications, with particular applications in wireless handheld electronics and consumer electronics.

SUMMARY OF THE INVENTION

According to one embodiment of the present invention, a semiconductor device includes a dual channel trench LDMOS transistor where the dual channel trench LDMOS transistor includes a semiconductor layer of a first conductivity type formed on a substrate; a first trench formed in the semiconductor layer, the first trench being filled with a trench dielectric, a trench gate being formed in the first trench and insulated from the sidewall of the first trench by a first gate dielectric layer, the trench gate forming a vertical channel of the LDMOS transistor; a body region of a second conductivity type formed in the semiconductor layer adjacent the first trench; a source region of the first conductivity type formed in the body region and adjacent the first trench; a planar gate insulated from the semiconductor layer by a second gate dielectric layer and overlying the body region, the source region being formed aligned to a first edge of the planar gate, the planar gate forming a lateral channel of the LDMOS transistor; a drain drift region of the first conductivity type formed in the semiconductor layer and in electrical contact with a drain electrode, and alternating N-type and P-type regions formed in the drain drift region where the alternating N-type and P-type regions having higher doping concentration than the drain-drift regions and forming a super-junction structure in the drain drift region.

DETAILED DESCRIPTION OF THE PREFERRED EMBODIMENTS

Figure 1:
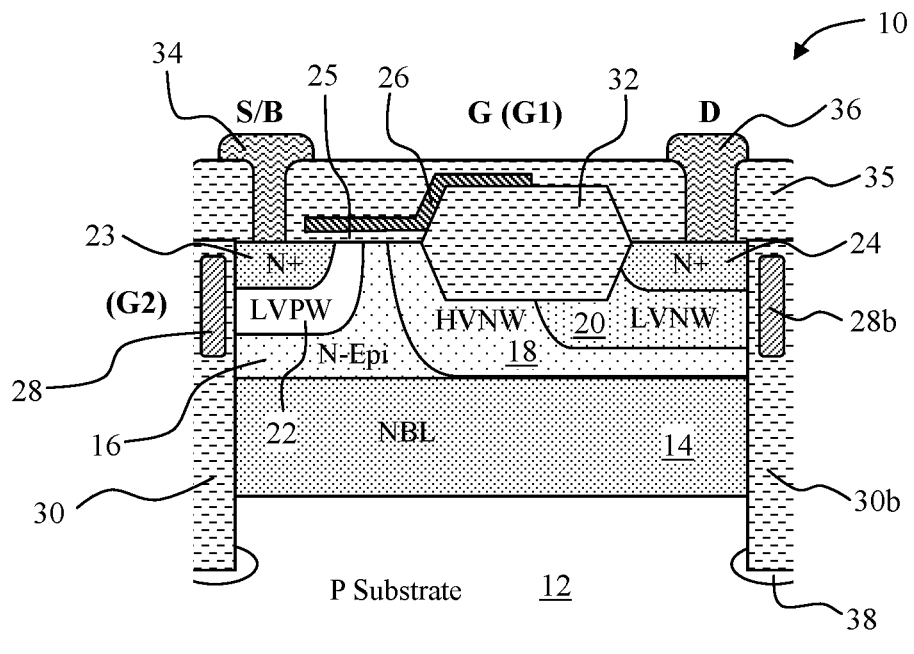
FIG. 1 is a cross-sectional view of a dual channel trench LDMOS transistor according to a first embodiment of the present invention.

In accordance with the principles of the present invention, a BCD (Bipolar-CMOS-DMOS) fabrication process incorporates deep oxide-filled trenches with single or stacked gate for use as deep trench isolation and for active gate. In some embodiments, a dual channel trench LDMOS is formed using the trench gate as a vertical channel and a planar gate as a lateral channel. In other embodiments, the bottom gate electrode is electrically connected to the source potential to provide increased shielding and improve the breakdown sustainability of the devices thus formed. In other embodiments, super-junction structures are formed in the drain drift region of the LDMOS transistor to reduce the drain resistance and increase the breakdown voltage in the drain drift region.

Through the use of deep trench isolation with trench gate structures, a low cost and high performance BCD process is realized. The BCD process in accordance with the present invention is able to eliminate several masks, thereby reducing the fabrication processing steps and complexity. The BCD process with deep trench isolation also realizes compact isolation, which along with the heavily doped N-type buried layer (NBL), reduces the parasitic PNP gain and thereby improves immunity to latch-up. The lateral NPN gain is reduced by deep trench isolation and by use of P channel stop implant at the bottom of the deep trenches.

The dual channel LDMOS transistor realizes higher channel density as two channels are formed in the same area of a conventional LDMOS transistor. Accordingly, the channel resistance (Rds*A) of the LDMOS transistor is reduced in half. By using a vertical and a lateral channel in a LDMOS transistor, the on-resistance of the LDMOS transistor is reduced and the performance of the LDMOS transistor is improved.

When the LDMOS transistor of the present invention incorporates super-junction structure at the drain region, further reduction in channel resistance (Rds*A) of the transistor is realized. In one embodiment, greater than 70% reduction in the total LDMOS resistance (Rds*A) is achieved.

(1) Dual Channel Trench LDMOS

According to one aspect of the present invention, a dual channel trench LDMOS includes a planar gate forming a lateral channel and an active trench gate forming a vertical channel. The trench gate is formed in a deep oxide filled trench where the deep oxide filled trench can also be used for high voltage isolation of the LDMOS transistor or other devices formed in the same fabrication processes. The trench gate of the LDMOS transistor forms a shielded gate trench (SGT) structure to realize lower gate to drain capacitance per unit area and to improve breakdown characteristics.

In some embodiments of the present invention, the dual channel trench LDMOS transistor is formed with a single shallow trench gate to act as the active gate for the LDMOS transistor. In other embodiment, a stacked gate structure is formed in the trench where the bottom gate forms an electrode connected to the source voltage used for super-junction effect in the drain region and to provide shielding.

(a) Single Active Gate

FIG. 1 is a cross-sectional view of a dual channel trench LDMOS transistor according to a first embodiment of the present invention. Referring to FIG. 1, a trench LDMOS transistor 10 is formed on a P-type substrate 12 with an N-type buried layer (NBL) 14 formed thereon. An N-type epitaxial (N-Epi) layer 16 is formed on the buried layer 14 in which the active regions of the transistor is formed. N-type buried layer 14 is optional and is generally included to improve device isolation and latchup immunity. N-type buried layer 14 may be omitted in other embodiments. The NBL 14 may be formed by a standard buried layer implantation process, or alternatively, may be formed using a step epitaxial process. That is, a heavily doped N-type epitaxial layer is first grown on top of the P substrate 12 to serve as NBL 14, and then the N-type epitaxial layer 16, less heavily doped than NBL 14, is grown on top of the epitaxially formed NBL 14. In the present description, the N-Epi layer 16, the N-buried layer 14 and the substrate 12 are sometimes referred to as the "semiconductor layers".

Deep trenches 30 are formed in the N-Epi 16 and N-buried layer 14 into the substrate 12. Trenches 30 are filled with a dielectric material. In the present embodiment, trenches 30 are filled with silicon oxide and thus are referred to as "oxide-filled trenches". In other embodiments, other dielectric materials may be used to fill trenches 30. Furthermore, a trench gate 28 is formed in the upper portions of trenches 30. In the present embodiment, trench gate 28 is a polysilicon gate. In other embodiments, other conductive gate materials may be used. Trench gate 28 is insulated from the sidewall of the trenches by a gate dielectric layer. The gate dielectric layer is typically formed separately from the trench oxide to obtain a better quality oxide. More specifically, the gate dielectric layer on the sidewall of the trenches is typically formed using thermal oxidation. As thus configured, oxide-filled trenches 30 form deep trench isolation structure for trench LDMOS transistor 10 and the trench gate 28 forms an active gate for trench LDMOS transistor 10, as will be described in more detail below.

Trench LDMOS transistor 10 includes a planar gate 26, an N+ source region 23 formed in a P-type body region 22, and an N+ drain region 24. In the present embodiment, planar gate 26 is a polysilicon (poly) gate and is insulated from the semiconductor layers by a thin gate oxide layer 25. In other embodiments, planar gate 26 can be formed using other conductive gate materials. The source region 23 is typically self-aligned to an edge of the planar gate 26. In the present embodiment, the P-type body region 22 is formed using a low voltage P-well (LVPW) in the fabrication process. In other embodiments, the P-type body region 22 may be formed through a P-type implant self-aligned to the edge of planar gate poly 26. Drain region 24 is formed in an N-type region and serves as the drain contact region of the LDMOS transistor. In the present embodiment, a drain drift region is formed using a low-voltage N-well (LVNW) 20 formed in a high-voltage N-well (HVNW) 18, both formed in the N-Epi layer 16. In general, the low-voltage N-well 20 has a higher doping concentration than the high-voltage N-well 18. The doping scheme used here is sometimes referred to as a graded doped drain, in which the doping increases from the body region 22 towards the N+ drain region 24. In other embodiments, the drain drift region can be formed using one or more N-type regions.

In the dual channel trench LDMOS transistor 10, a P+ region is included for making electrical contact to body region 22. In the present embodiment, the P+ body contact region is formed in the z-direction of the device, that is, perpendicular to the cross-section shown in FIG. 1. Therefore, the P+ body contact region is not shown in FIG. 1. The P+ body contact region can be formed as alternating N+ and P+ regions or the P+ regions can be formed in islands or stripes, as shown in FIGS. 3-6 and described in more detail below. The exact structure of the P+ body contact region is not critical to the practice of the present invention and it is only necessary that the P+ body contact region be spaced apart from trench 30 including the active trench gate.

In the present embodiment, the end portion of planar gate 26 extends over a field oxide layer 32. Extending planar gate 26 over a field oxide layer 32 has the effect of relaxing the electric field at the edge of the planar gate 26. In other embodiments, the planar gate can extend over a step oxide layer or other oxide structure. A step oxide layer refers to an oxide layer formed on top of the semiconductor layers, as opposed to a field oxide layer which is formed partially in the semiconductor layers as the field oxide layer consumes the silicon in the topmost semiconductor layer when formed. In yet other embodiments, the planar gate can be formed entirely on the gate oxide layer formed on the semiconductor layers without any end portion extending over any other oxide structure.

Trench LDMOS transistor 10 further includes an insulating dielectric layer 35 formed over the semiconductor layers. A contact opening is made in the insulating dielectric layer 35 to the N+ source 23 and a metal contact 34 is formed as an electrical contact to the N+ source (and to the P+ body where applicable). Another contact opening is made in the insulating dielectric layer 35 to the N+ drain 24 and a metal contact 36 is formed as an electrical contact to the N+ drain.

As thus constructed, trench LDMOS transistor 10 includes two active gates and two channels. Planar gate 26 forms a lateral channel in the P-body region 22 near the surface of the semiconductor layers (i.e. N-Epi 16). Electrons flow from the N+ source region 23, through the lateral channel in the P-body region 22 in the lateral direction into the drain drift region formed by N-Epi 16, N-well 18 and N-well 20 until N+ drain region 24 is reached. Meanwhile, trench gate 28 forms a vertical channel in the P-body region 22 along the side of the trench 30. Electrons flow from the N+ source region 23, through the vertical channel in the P-body region 22 in the vertical direction into the N-Epi layer 16 and into the N-buried layer 14. Electrons from the vertical channel flow laterally across the N-buried layer 14 and then up through the N-wells 18, 20 to reach the N+ drain region 24.

By forming a vertical channel in conjunction with a lateral channel in LDMOS transistor 10, an immediate reduction in the channel resistance Rds*A of up to 50% is obtained, assuming both planar gate and vertical gate have the same width. The two channels allow the channel width W of the transistor to be increased while reducing the channel resistance in half.

In one embodiment, the planar gate and the trench gate are electrically connected so both lateral and vertical channels switch on and off at the same time. In another embodiment, the planar gate and the trench gate are separately controlled so that each gate turns on and off independently of each other. This configuration is referred to as "W switching" as the width of the transistor is selectively switched to increase or decrease the total width of the active gate. More specifically, under high current situations, both the planar gate and the trench gate are switched on and off in unison. However, when the current demand decreases, only one of the gates is activated for use. Either the planar gate or the trench gate can be selected for use in low current conditions. In this manner, in low current conditions, the gate capacitance is reduced because only a portion of the total gate, e.g. only the planar gate, is activated.

In FIG. 1, trench gate 28*b* formed in a trench 30*b* on the drain side of LDMOS transistor 10 can be used as an active gate for an adjacent trench LDMOS transistor. In the case when oxide-filled trench 130 on the drain side is used only for isolation, then trench gate 28*b* is grounded or connected to an electrical potential to deactivate the gate.

Furthermore, in FIG. 1, a P-type channel stop region 38 is formed at the bottom of trenches 30. P-type channel stop region 38 has the function of reducing the lateral NPN gain, thereby improving latchup immunity. Channel stop region 38 is optional and may be omitted in other embodiments of the present invention.

(b) Stacked Gate

Figure 2:
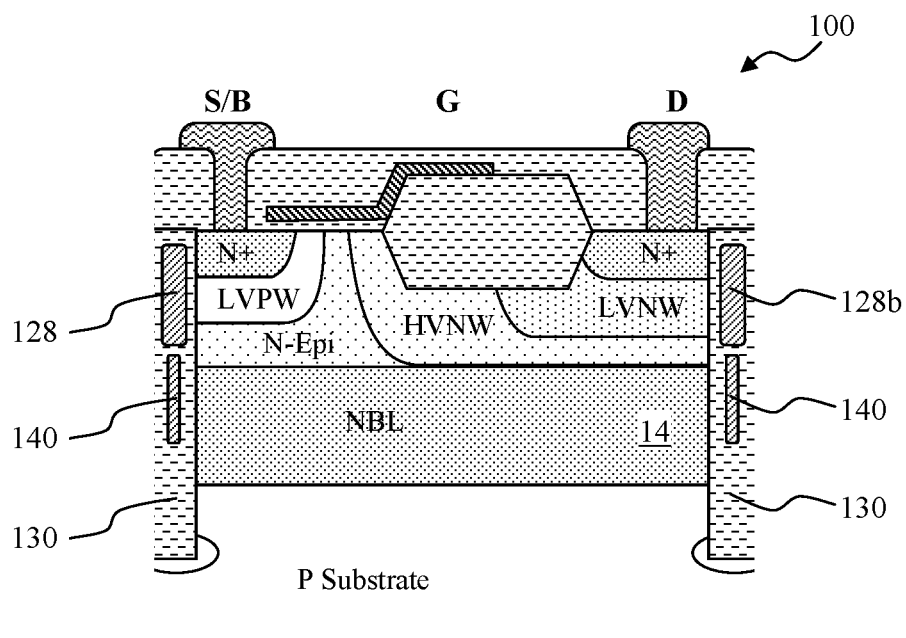
FIG. 2 is a cross-sectional view of a dual channel trench LDMOS transistor according to a second embodiment of the present invention.

FIG. 2 is a cross-sectional view of a dual channel trench LDMOS transistor according to a second embodiment of the present invention. Referring to FIG. 2, a trench LDMOS transistor 100 is constructed in substantially the same manner as trench LDMOS transistor 10 of FIG. 1 except with the use of the stacked gate structure in the trenches. Like elements in both figures will not be further described. In the present embodiment, trench LDMOS transistor 100 includes deep oxide-filled trenches 130 with a stacked gate structure formed therein. That is, each oxide-filled trench 130 includes a trench gate 128 formed at an upper portion of the trench and a bottom gate electrode 140 formed at a bottom portion of the trench. Trench gate 128 and bottom gate electrode 140 are insulated from each other. In one embodiment, both the trench gate and the bottom gate electrode are formed of polysilicon. In other embodiments, other conductive gate materials may be used.

More specifically, trench gate 128 is connected to a gate potential when trench gate 128 is used as an active gate for trench LDMOS transistor 100. The trench gate can also be grounded or otherwise deactivated when the trench gate is not used as an active gate (such as trench gate 128*b*). Bottom gate electrode 140 is electrically connected to the source potential to realize super-junction effect in the drain region. Bottom gate electrode 140 also has the function of increasing shielding of the trench gate 128 from the drain potential at the N-buried layer 14.

In the present embodiment, the bottom gate electrode 140 is thinner than the trench gate 128 and the trench oxide is thicker adjacent the bottom gate electrode 140 as a result. The thicker trench oxide has the effect of increasing the breakdown sustainability of the trench isolation structure. The trench oxide at bottom gate electrode is sandwiched between the bottom gate electrode, which is electrically connected to the source, and the N-buried layer 14 which is electrically connected to the drain. Thus the trench oxide adjacent the bottom gate must be capable of sustaining the drain-to-source voltage of the trench LDMOS transistor.

(c) Layout Designs for Trench and Poly Gate

Figure 3:
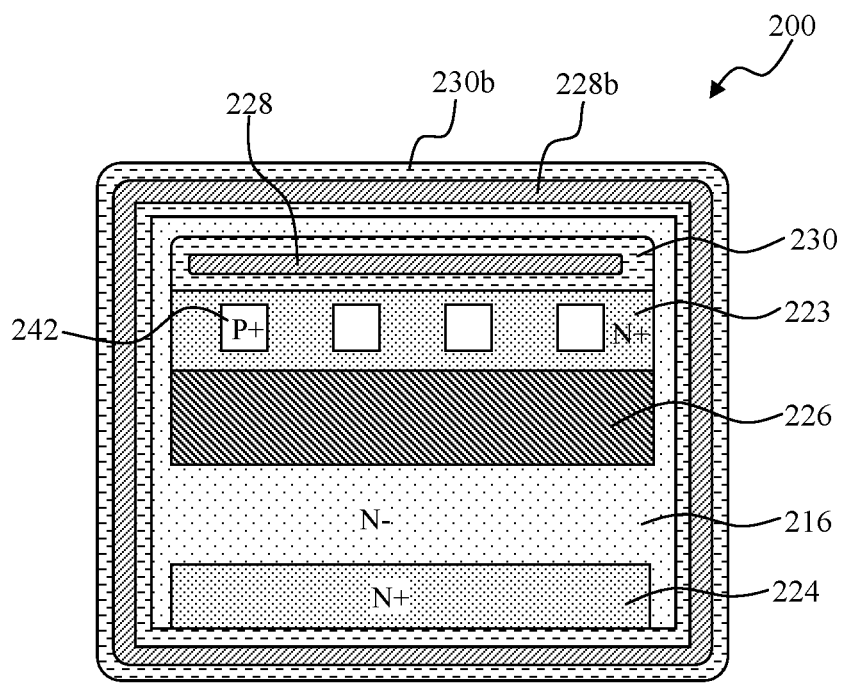
FIG. 3 is a top view of a dual channel trench LDMOS transistor according to a third embodiment of the present invention.

FIG. 3 is a top view of a dual channel trench LDMOS transistor according to a third embodiment of the present invention. Referring to FIG. 3, a dual channel trench LDMOS transistor 200 includes a planar gate 226, N+ source region 223, P+ body contact regions 242 and N+ drain region 224. A p-type body region (not shown) is located underneath the planar gate 226 and the source 223. The drain drift region is formed in the N-Epi layer 216. The drain drift region may also include other N-type regions such as a high voltage N-well (HVNW), and/or a low voltage N-well (LVNW) (not shown in FIG. 3). In the present embodiment, a trench 230b including a trench gate 228b form an isolation structure for trench LDMOS transistor 200. Trench 230b encircles the active areas of trench LDMOS transistor 200 and isolates trench LDMOS transistor 200 from other devices formed on the same substrate. Trench gate 228b can be left floating.

In trench LDMOS transistor 200, another trench 230 houses a trench gate 228 for use as an active gate in LDMOS transistor 200. The trench gate 228 used for an active gate is separated from the trench gate 228b used for isolation. As thus constructed, dual channel trench LDMOS transistor 200 is formed having a lateral channel formed by planar gate 226 and a vertical channel formed by trench gate 228.

Figure 4:
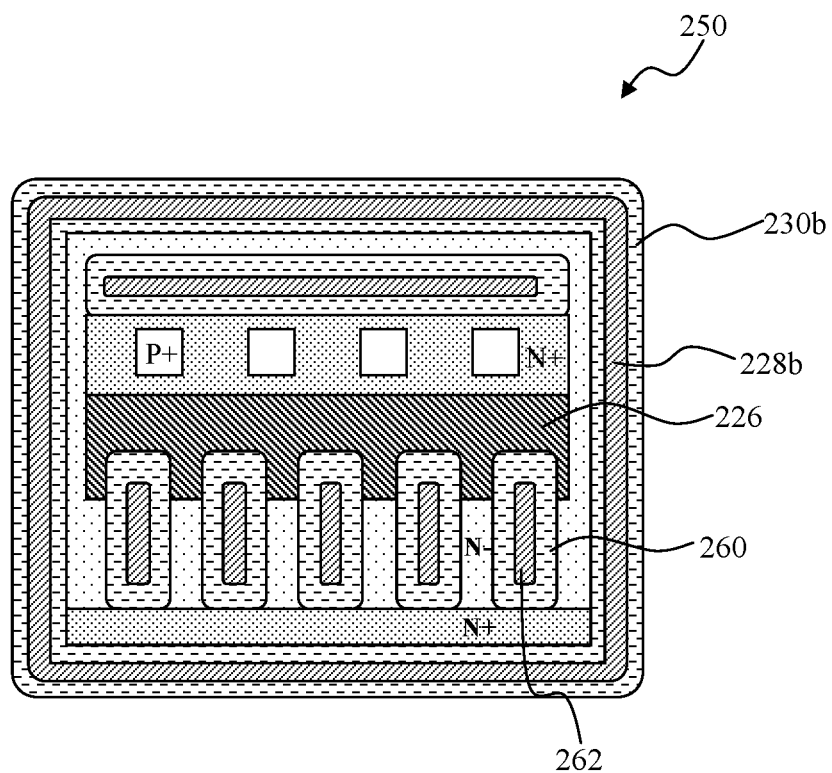
FIG. 4 is a top view of a dual channel trench LDMOS transistor according to a fourth embodiment of the present invention.

FIG. 4 is a top view of a dual channel trench LDMOS transistor according to a fourth embodiment of the present invention. Trench LDMOS transistor 250 of FIG. 4 is substantially the same as trench LDMOS transistor 200 of FIG. 3 and like elements in both figures will not be further described. Referring to FIG. 4, the trench LDMOS transistor 250 includes trench fingers 260 formed in the drain drift region of the transistor to form interdigitated trench and drain drift regions. The trench gate 262 of the interdigitated trench fingers 260 is electrically connected to the source potential. In this manner, a super-junction structure is formed in the drain of trench LDMOS transistor 250. The super-junction structure thus formed allows higher drain doping level to be used to increase the breakdown voltage and to reduce the drain-to-source resistance. In the present embodiment, the sidewall oxide of the interdigitated trench fingers 260 is thicker than the gate oxide in order to support the source to drain voltage. It is imperative to note that where the trench fingers 260 intersect with the planar gate 226, the planar gate 226 actually is located on top of the trench fingers 260, but it is depicted the other way around in FIG. 4 to better show the structure of the trench fingers 260.

In trench LDMOS transistor 250, a trench 230b including a trench gate 228b form an isolation structure for trench LDMOS transistor 250. As described above, trench gate 228b can be left floating. Furthermore, the trench oxide insulating the trench gate 228b has a thickness greater than the thickness of the gate oxide layer for a trench gate so that the isolation structure of trench 230B can withstand higher voltages.

Figure 5:
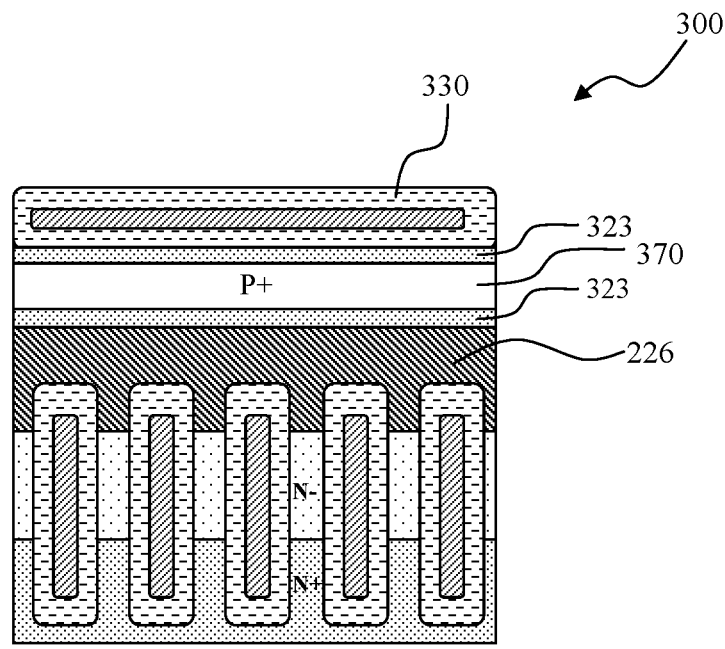
FIG. 5 is a top view of a dual channel trench LDMOS transistor according to a fifth embodiment of the present invention.
Figure 6:
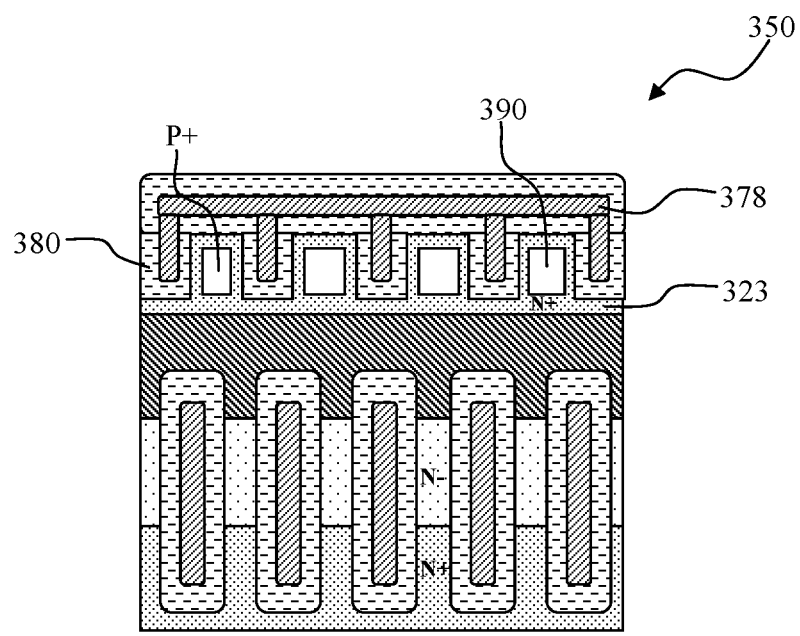
FIG. 6 is a top view of a dual channel trench LDMOS transistor according to a sixth embodiment of the present invention.

FIG. 5 is a top view of a dual channel trench LDMOS transistor according to a fifth embodiment of the present invention. FIG. 6 is a top view of a dual channel trench LDMOS transistor according to a sixth embodiment of the present invention. Trench LDMOS transistor 300 of FIG. 5 and trench LDMOS transistor 350 of FIG. 6 are substantially the same as trench LDMOS transistor 250 of FIG. 4 and like elements in all the several figures will not be further described. As described above, a P+ body contact region is to be provided in the trench LDMOS transistor for making electrical contact to the body of the transistor. Referring to FIG. 5, a P+ body contact region 370 is formed in the N+ region 323 but apart from the sidewall of trench 330 and the planar gate 226. Referring to FIG. 6, the P+ body contact regions are formed as separate P+ islands 390 in the N+ source region 323. The body contact region of trench LDMOS transistor can be formed in other ways suitable for making an electrical connection to the P-body region of the LDMOS transistor.

LDMOS transistor 350 of FIG. 6 further illustrates the formation of an interdigitated oxide-filled trench 380 with the trench gate 378 extending into the interdigitated trench regions to form gate extensions. The gate extensions increase the channel width of the dual channel LDMOS transistor.

(2) Trench Isolation in BCD Process

According to another aspect of the present invention, the deep oxide-filled trenches with single or stacked gate described above, besides being used as active gates, are also used for deep trench isolation of devices in a BCD process. In this manner, a single oxide-filled trench structure in the BCD process is used for isolation of all devices (bipolar, CMOS, DMOS) and also as active gates for the dual channel trench LDMOS transistors.

Figure 7:
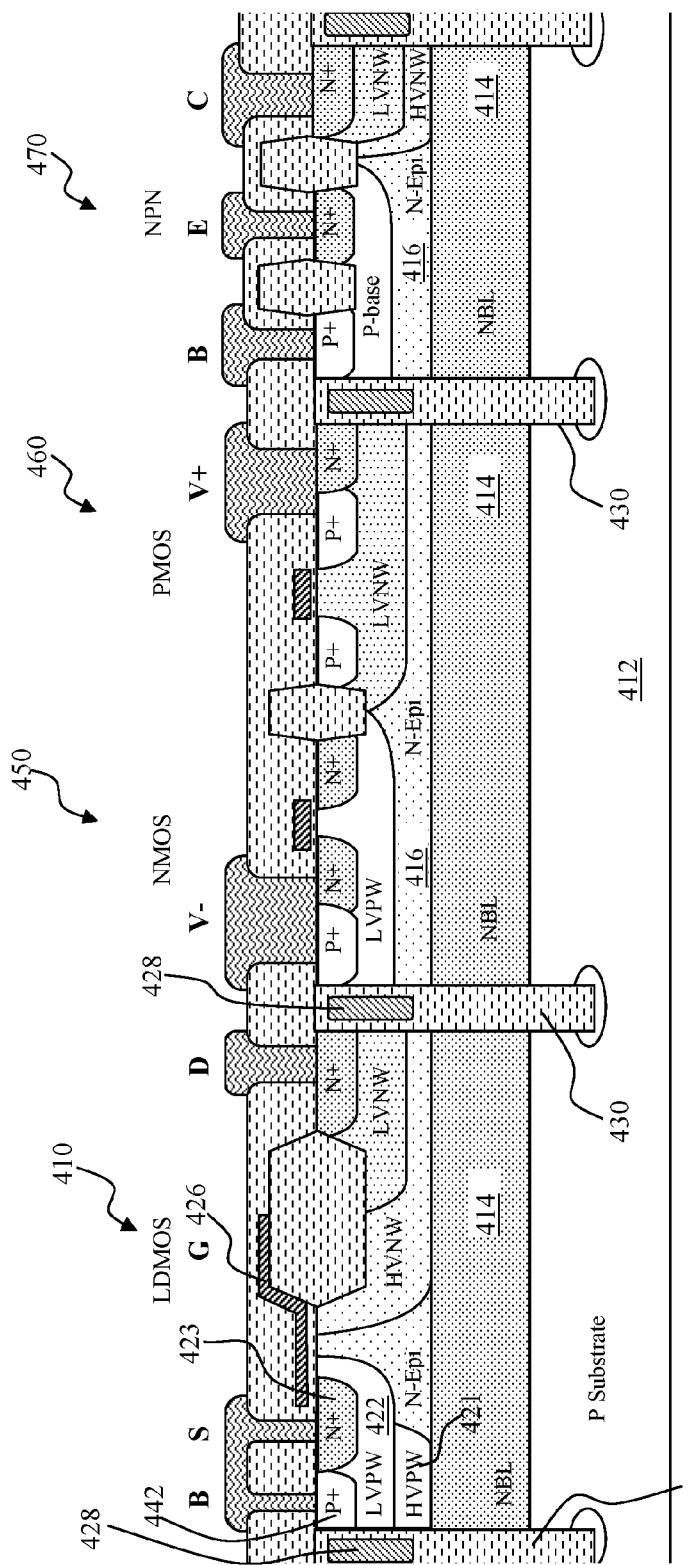
FIG. 7 is a cross-sectional view of transistor devices formed using the BCD process employing deep trench isolation according to one embodiment of the present invention.

FIG. 7 is a cross-sectional view of transistor devices formed using the BCD process employing deep trench isolation according to one embodiment of the present invention. Referring to FIG. 7, a BCD fabrication process forms an LDMOS transistor 410, an N-type metal oxide semiconductor (NMOS) transistor 450, a P-type metal oxide semiconductor (PMOS) transistor 460, and an NPN bipolar junction transistor (BJT) 470 all on P-type substrate 412 with N-buried layer 414 and N-Epi layer 416. Oxide-filled trenches 430 are formed in the semiconductor layers and extend into the P-type substrate 412 to provide device isolation. In the present embodiment, a single trench gate 428 is formed in trenches 430.

In the present embodiment, oxide-filled trenches 430 with the single trench gate are formed to provide isolation between the trench LDMOS transistor 410, the MOS transistors 450, 460 and the bipolar transistor 470. Because the same trench structure is to be used for all the devices in the BCD fabrication process, the oxide-filled trenches 430 all contain the trench gate 428 regardless of whether the trench gate is used as an active gate or not. In the case when trench 430 is used only for device isolation, the trench gate 428 becomes a dummy gate and is electrically floated or connected to other appropriate electrical potential to deactivate the gate. By using trenches 430, transistor devices formed in the BCD processes can be individually isolated. Furthermore, trenches 430 realize a compact isolation scheme, thereby increasing the density and reducing the cost of the BCD process.

In the present embodiment, trench gate 428 forms a vertical channel to the N-buried layer 414 in LDMOS transistor 410. Thus, LDMOS transistor 410 is a dual channel trench LDMOS transistor device with planar gate 426 and vertical gate 428. In an alternate embodiment, LDMOS transistor 410 may be formed as a single channel transistor device. The planar gate 426 may be made the only active gate in the transistor. The trench gate 428 adjacent the body region (low voltage P-well 422) of the LDMOS transistor can be inactivated by leaving it floating or connecting it to an appropriate potential to deactivate the gate.

In LDMOS transistor 410 of FIG. 7, the P-body region is formed by a low voltage P-well 422 and further by a high voltage P-well 421. The high voltage P-well 421 has a lower doping concentration than the low voltage P-well 422.

In other embodiments of the present invention, the BCD process incorporates devices using P-type buried layer and the same oxide-filled trench structure described above is used to isolate devices formed over the P-buried layer. In yet another embodiment, the BCD process incorporates a vertical MOSFET device, such as a vertical DMOS device. The oxide-filled trench structure is used to provide the active gate for the vertical channel of the vertical MOSFET devices.

Figure 8:
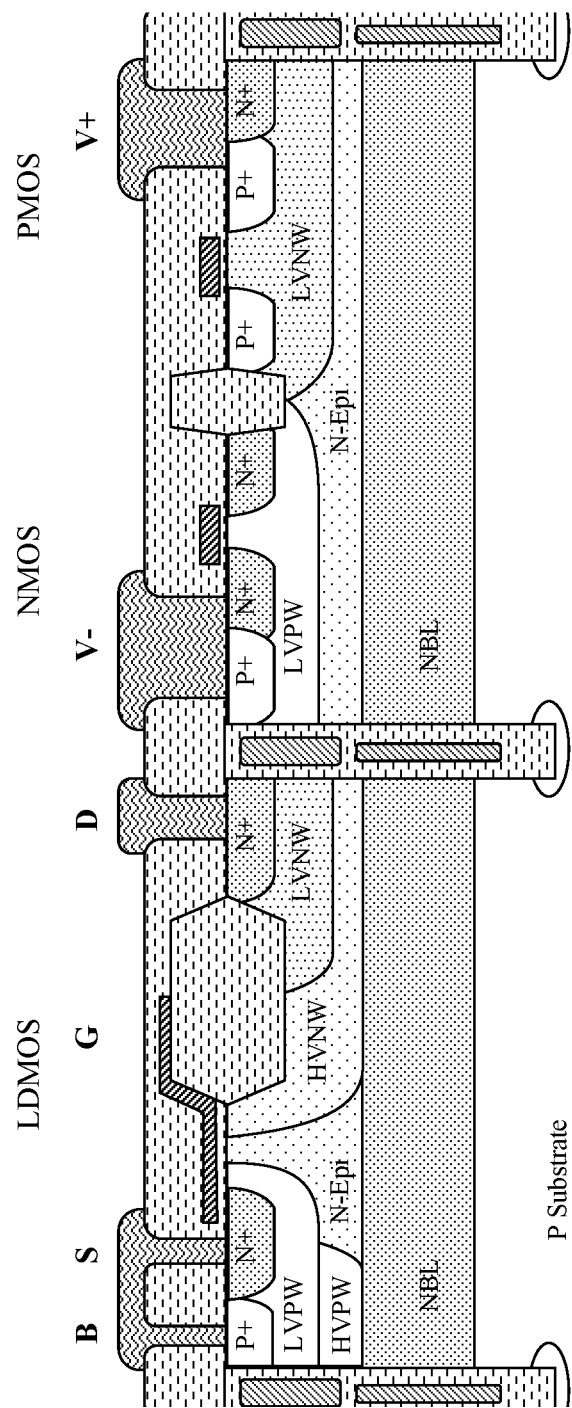
FIG. 8 is a cross-sectional view of transistor devices formed using the BCD process employing deep trench isolation according to another embodiment of the present invention.

FIG. 8 is a cross-sectional view of transistor devices formed using the BCD process employing deep trench isolation according to an alternate embodiment of the present invention. The BCD fabrication process of FIG. 8 is substantially the same as the BCD fabrication process of FIG. 7 for forming an LDMOS transistor, an NMOS transistor, and a PMOS transistor as well as bipolar transistors (not shown) all on P-type substrate with N-buried layer and N-Epi layer. The BCD fabrication process of FIG. 8 illustrates the use of a stacked gate structure in the oxide-filled trenches for providing additional shielding.

(3) Drain Super-junction Structures

According to another aspect of the present invention, super-junction structures are formed in the drain drift region of a dual channel trench LDMOS transistor to reduce the drain resistance and increase the breakdown voltage of the LDMOS transistor. In one embodiment of the present invention, the super-junction structure is formed using alternating layers of N-type and P-type regions. Because the width of the N-type and P-type regions of the super-junction structure are selected so that they are fully depleted in operation, the super-junction structure can be formed using higher doping level than the doping level of a conventional drain drift region. The higher doping level reduces the drain resistance and while the depletion of the super-junction structure increases the breakdown voltage of the drain drift region.

Figures 9, 10:
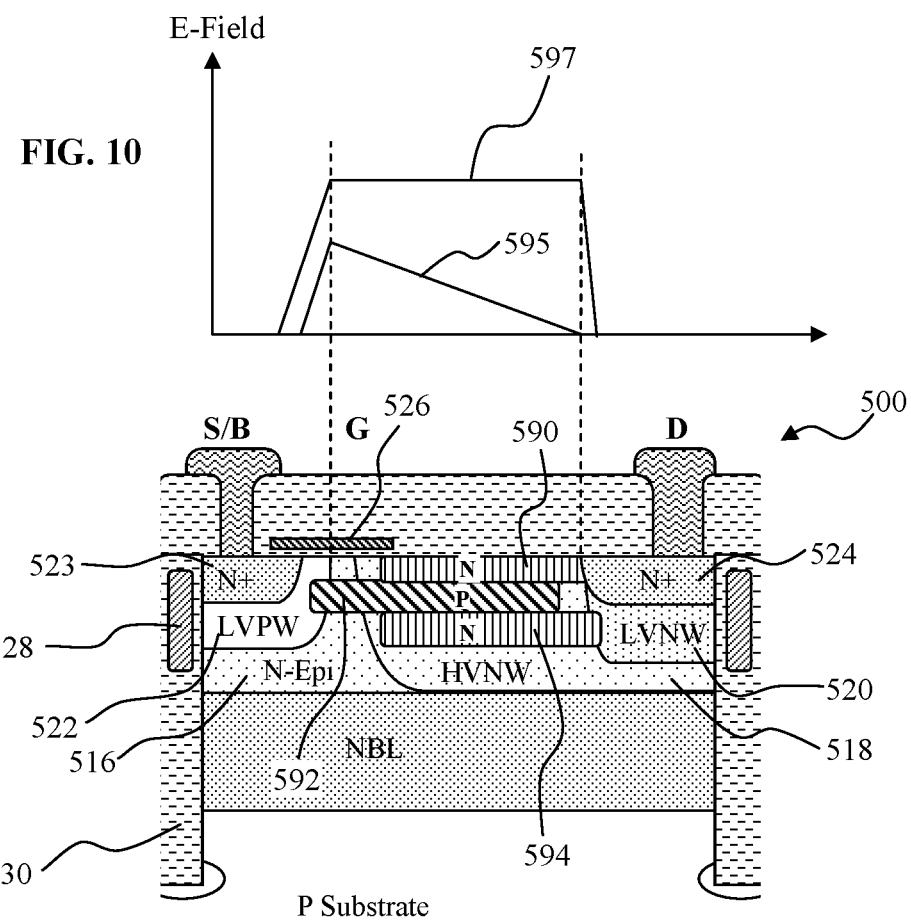
FIG. 9 is a cross-sectional view of a dual channel trench LDMOS transistor incorporating a drain super-junction structure according to one embodiment of the present invention.
FIG. 10 illustrates the electrical field distribution of the LDMOS transistor of FIG. 9 with or without the super-junction structure.
Figure 11:
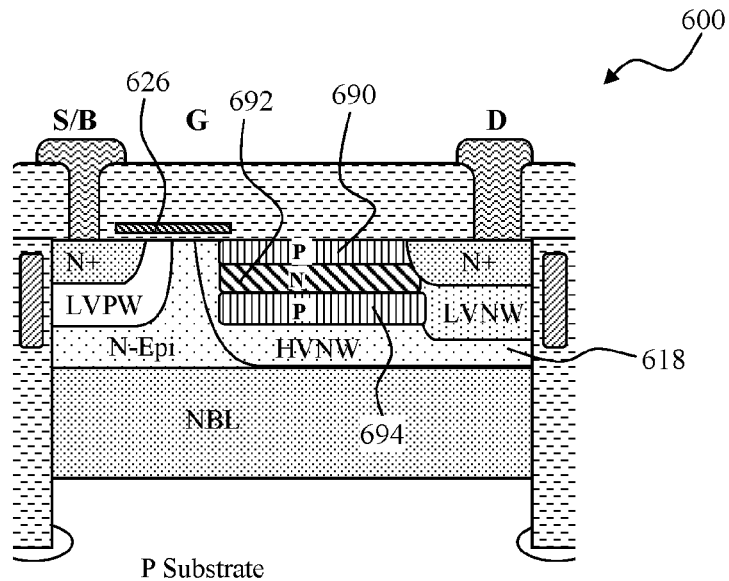
FIG. 11 is a cross-sectional view of a dual channel trench LDMOS transistor incorporating a drain super-junction structure according to an alternate embodiment of the present invention.

FIGS. 9 and 11 are cross-sectional view of dual channel trench LDMOS transistors with super-junction structures formed in the drain drift region according to different embodiments of the present invention. Referring first to FIG. 9, dual channel trench LDMOS transistor 500 is constructed in substantially the same manner as dual channel trench LDMOS transistor 10 of FIG. 1 and like elements in both figures will not be further described. Dual channel trench LDMOS transistor 500 includes a planar gate 526 forming a lateral channel and a trench gate 528 forming a vertical channel. In the present embodiment, the planar gate 526 does not extend over a field oxide layer.

Trench LDMOS transistor 500 includes alternating N-type and P-type doped regions forming a super-junction structure in the drain drift region of the trench LDMOS transistor. In the present embodiment, the alternating N-type and P-type doped regions include a first N-type region 590, a second N-type region 594, and a P-type region 592 sandwiched between the first and second N-type regions, all formed in the high voltage N-well 518 being the drain drift region. N-type regions 590 and 594 and P-type region 592 are more heavily doped than the underlying N-well 518 because the regions are depleted in operation. In the present embodiment, P-type region 592 extends into the P-body region formed by low voltage P-well 522.

In one embodiment, the alternating N-type and P-type regions are formed using multiple energy implants through a single mask. Furthermore, in another embodiment, the alternating N-type and P-type regions are formed self-aligned to the planar gate 526. The P-type region 592 extending into the P-body region 522 can be realized through an angle implant and subsequent drive-in.

As thus constructed, the alternating N-type and P-type regions in the drain drift region have the effect of distributing the electric field and increasing the breakdown voltage of the LDMOS transistor. FIG. 10 illustrates the electrical field distribution of the trench LDMOS transistor of FIG. 9 with and without the super-junction structure. Curve 595 illustrates the electric field distribution without the super-junction structure. The electric field rises in the body region until the P-N junction between the body region and the N-Epi where the critical electric field is reached. Then, the electric field decreases along the length of the drain drift region. Curve 597 illustrates the electric field distribution with the super-junction structure. Electrical field is a function of the doping levels on either side of the P-N junction. With a higher doping level, the critical electric field is increased. Thus, as shown in FIG. 10, curve 597 rises to a high electric field level in the body region. Then, the super-junction regions formed by the N-type and P-type regions 590, 592, 594, have the effect of distributing the electric field out evenly so that the electrical field distribution takes on a trapezoidal shape as opposed to the triangular shape of curve 595. It is well known that the area under the electric field is the breakdown voltage of the transistor. By changing the electric field distribution to the trapezoidal shape, the area under curve 597 is much greater than the area under curve 595 and the breakdown voltage of trench LDMOS transistor 500 with the super-junction structure accordingly increases.

Referring now to FIG. 11, dual channel trench LDMOS transistor 600 is constructed in the same manner as trench LDMOS transistor 500 of FIG. 9 except for the super-junction structure and like elements in both figures will not be further described. In trench LDMOS transistor 600, the super-junction structure is formed by a first P-type region 690, a second P-type region 694, and an N-type region 692 sandwiched between the first and second P-type regions, all formed in the high voltage N-well 618. In the present embodiment, the N-type region 692 is more heavily doped than the P-type regions. By placing the N-type region 692 between the two P-type regions 690 and 694, the P-type regions act like super-junction or function as RESURF regions for reducing the surfacing electric field of the LDMOS transistor. The breakdown voltage of the trench LDMOS transistor is thereby increased. In trench LDMOS transistor 600, the alternating N-type and P-type regions are formed self-aligned to the planar gate 626. In the present embodiment, the N-type region 692 does not extend outside of the high voltage N-well (HVNW) 618. In an alternative embodiment, the N-type region 692 may extend outside of the high voltage N-well, such as by use of an angle implant instead of self-aligning the N-type implant to the edge of the planar gate 626.

(4) Alternate Embodiments

Figure 12:
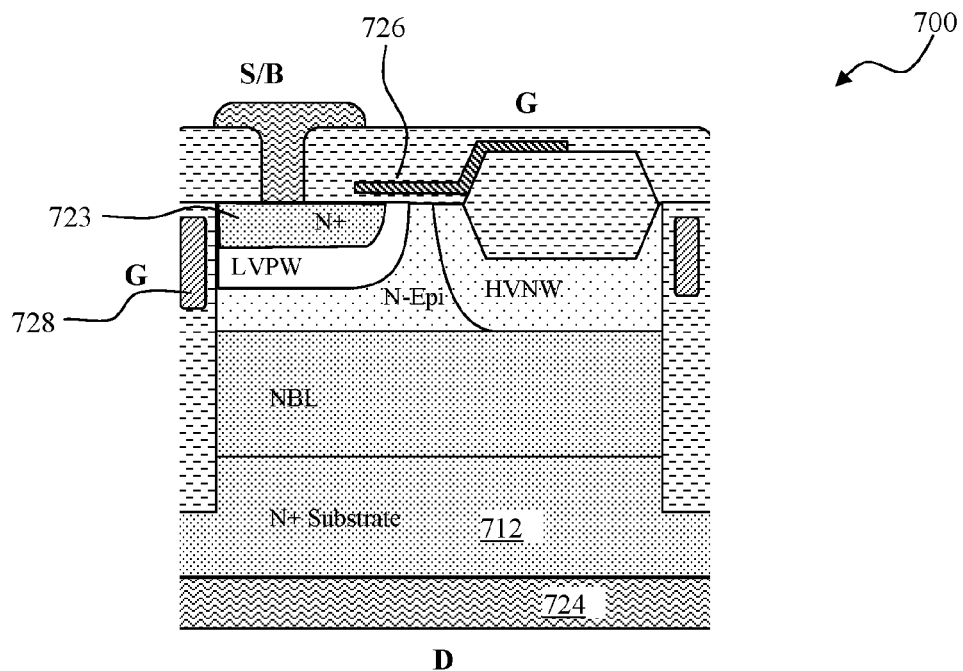
FIG. 12 is a cross-sectional view of a dual channel trench LDMOS transistor incorporating a bottom drain according to another embodiment of the present invention.

FIG. 12 is a cross-sectional view of a dual channel trench LDMOS transistor according to an alternate embodiment of the present invention. Referring to FIG. 12, dual channel trench LDMOS transistor 700 is formed on an N+ substrate 712 instead of a P+ substrate as in the previous embodiments. The drain region 724 is formed on the backside of the N+ substrate 712, thereby forming a vertical LDMOS device. Trench LDMOS transistor 700 includes a planar gate 726 and a vertical gate 728 and N+ source region 723, all formed in a similar manner as described above.

Figure 13:
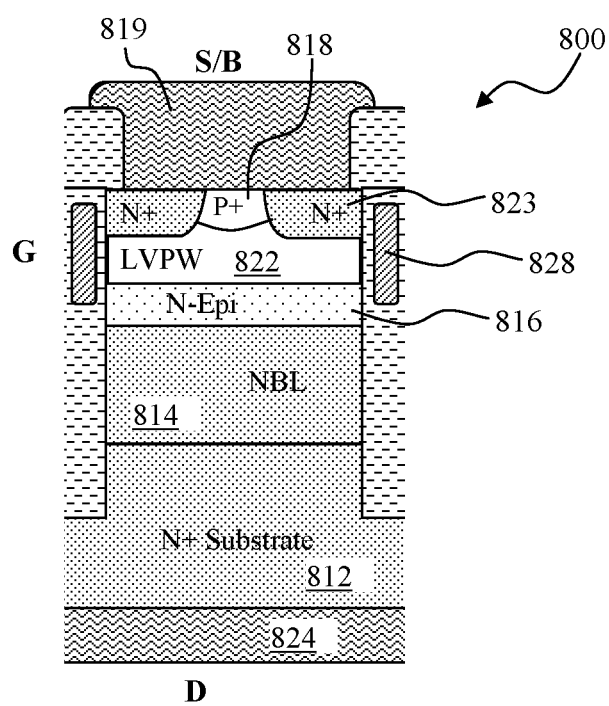
FIG. 13 is a cross-sectional view of a vertical trench MOS transistor which may be integrated with a dual channel device according to one embodiment of the present invention.

FIG. 13 is a cross-sectional view of a vertical trench MOS transistor according to one embodiment of the present invention. Referring to FIG. 13, vertical trench MOS transistor 800 is formed on an N+ substrate 812 and can be integrated with a dual channel LDMOS transistor device such as transistor 700 shown in FIG. 12. In vertical trench MOS transistor 800, trench gate 828 forms the vertical gate of the MOS transistor and a vertical channel is formed in the low voltage P-well (LVPW) 822. In the vertical trench MOS transistor 800, currents flow from the source region 823 through the channel region in LVPW 822 into N-epitaxial layer 816, N-buried layer 814 and then to N+ substrate 812. A drain electrode 824 is provided on the backside of substrate 812. A P+ body contact 818 is also provided on the surface for good contact to the source metal 819.

Figure 14:
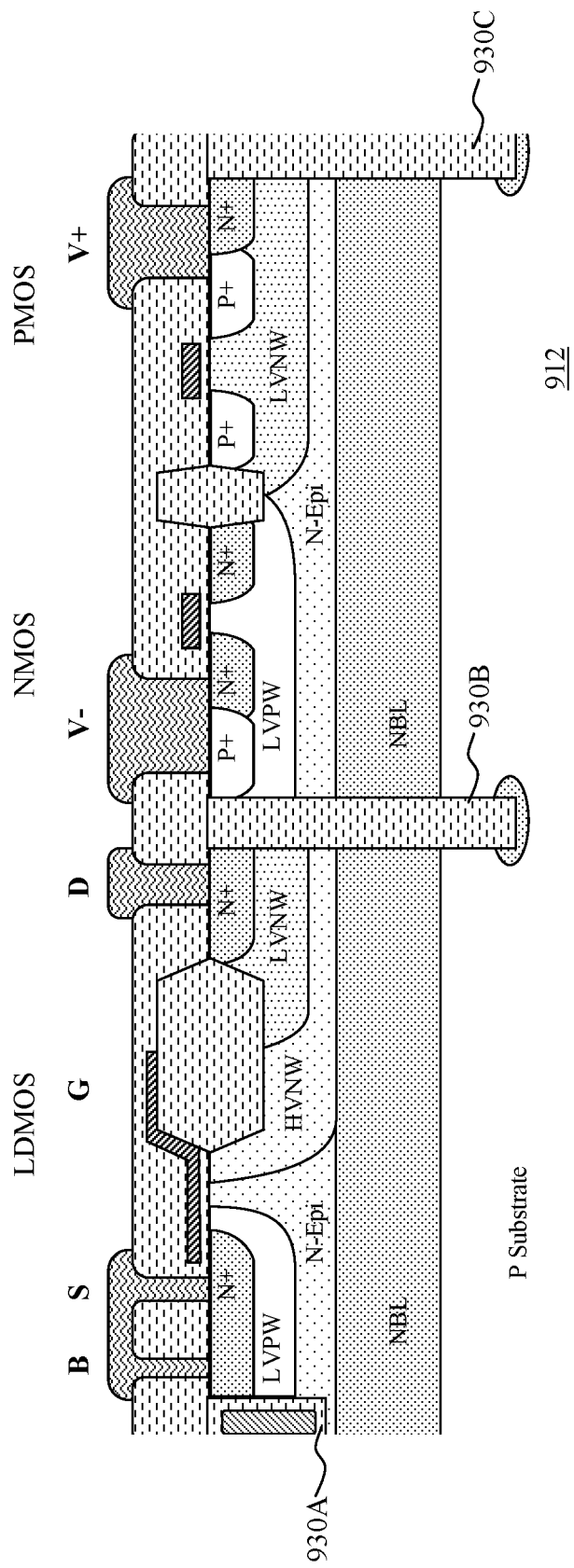
FIG. 14 is a cross-sectional view of transistor devices formed using the BCD process employing deep trench isolation according to an alternate embodiment of the present invention.

FIG. 14 is a cross-sectional view of transistor devices formed using the BCD process employing deep trench isolation according to an alternate embodiment of the present invention. The transistor devices in FIG. 14 are constructed in a substantially similar manner as the transistor devices in FIG. 8 and like elements in both figures will not be further described. Referring to FIG. 14, deep trenches 930B and 930C are used for device isolation. Deep trenches 930B and 930C extend into the P-type substrate 912. In the present embodiment, deep trenches 930B and 930C do not include any trench gate structures and are purely oxide filled trenches. In other embodiments, the deep trenches may include a single trench gate or a stacked gate structure, as described above. Meanwhile, shallow trenches, such as trench 930A, are used to house the active gate. Shallow trench 930A extends only into the N-Epi and does not extend into the P-type substrate.

The above detailed descriptions are provided to illustrate specific embodiments of the present invention and are not intended to be limiting. Numerous modifications and variations within the scope of the present invention are possible. The present invention is defined by the appended claims.

I claim:

1. A semiconductor device comprising a dual channel trench LDMOS transistor, the dual channel trench LDMOS transistor comprising:
   a semiconductor layer of a first conductivity type formed on a substrate;
   a first trench formed in the semiconductor layer, the first trench being filled with a trench dielectric, a trench gate being formed in the first trench and insulated from the sidewall of the first trench by a first gate dielectric layer, the trench gate forming a vertical channel of the LDMOS transistor;
   a body region of a second conductivity type formed in the semiconductor layer adjacent the first trench;
   a source region of the first conductivity type formed in the body region and adjacent the first trench;
   a planar gate insulated from the semiconductor layer by a second gate dielectric layer and overlying the body region, the source region being formed aligned to a first edge of the planar gate, the planar gate forming a lateral channel of the LDMOS transistor;
   a drain drift region of the first conductivity type formed in the semiconductor layer and in electrical contact with a drain electrode; and
   a plurality of alternating N-type and P-type regions formed in the drain drift region, the plurality of alternating N-type and P-type regions having higher doping concentration than the drain-drift regions and forming a super-junction structure in the drain drift region.

2. The semiconductor device of claim 1, wherein the planar gate forms the lateral channel of the LDMOS transistor in the body region between the source region and the drain drift region, and the trench gate in the first trench forms the vertical channel of the LDMOS transistor in the body region along the sidewall of the first trench between the source region and the semiconductor layer.

3. The dual channel trench LDMOS transistor of claim 1, wherein the first conductivity type is N-type conductivity and the second conductivity type is P-type conductivity.

4. The dual channel trench LDMOS transistor of claim 3, wherein the plurality of alternating N-type and P-type regions comprises a first N-type region and a second N-type region and a P-type region sandwiched between the first and second N-type regions, the first and second N-type regions being self-aligned to a second edge of the planar gate and the P-type region being extended to the body region.

5. The dual channel trench LDMOS transistor of claim 3, wherein the plurality of alternating N-type and P-type regions comprises a first P-type region and a second P-type region and an N-type region sandwiched between the first and second P-type regions, the first and second P-type regions and the N-type region being self-aligned to a second edge of the planar gate.

6. The semiconductor device of claim 1, wherein the substrate comprises a substrate of the second conductivity type and the LDMOS transistor further comprises a drain region of the first conductivity type formed in the semiconductor layer, the drain region being spaced apart from the body region by the drain drift region, the drain region being electrically connected to the drain electrode.

7. The semiconductor device of claim 6, wherein the first trench extends through the semiconductor layer into the substrate, the trench gate being formed in an upper portion of the first trench and the semiconductor device further comprises:
   a bottom gate electrode being formed in a lower portion of the first trench and insulated from the sidewall of the first trench by the trench dielectric having a second thickness, the second thickness being greater than the thickness of the first gate dielectric layer insulating the trench gate, the bottom gate electrode being electrically connected to a source potential.

8. The semiconductor device of claim 7, further comprising:
   a second trench formed in the semiconductor layer and extending into the substrate, the second trench being filled with a trench dielectric, a trench gate being formed in an upper portion of the second trench and insulated from the sidewall of the second trench by a third gate dielectric layer, and a bottom gate electrode being formed in a lower portion of the second trench and insulated from the sidewall of the second trench by the trench dielectric, the trench dielectric having a thickness greater than the third gate dielectric layer, the trench gate being electrically floating or electrically connected to a given potential for deactivating the trench gate in the second trench, and the bottom gate electrode being electrically connected to a source potential,
   wherein the second trench encircles active areas of the LDMOS transistor to provide electrical isolation of the LDMOS transistor.

9. The semiconductor device of claim 8, further comprising a MOS or bipolar transistor formed in the semiconductor layer adjacent to the second trench, the MOS or bipolar transistor being electrically isolated from the LDMOS transistor by the second trench.

10. The semiconductor device of claim 8, wherein the third gate dielectric layer has a thickness greater than the thickness of the first gate dielectric layer.

11. The semiconductor device of claim 6, wherein the first trench extends only into the semiconductor layer and the semiconductor device further comprises:

a second trench formed in the semiconductor layer and extending into the substrate, the second trench being filled with the trench dielectric, wherein the second trench encircles active areas of the LDMOS transistor to provide electrical isolation of the LDMOS transistor.

12. The semiconductor device of claim 11, further comprising a MOS or bipolar transistor formed in the semiconductor layer adjacent to the second trench, the MOS or bipolar transistor being electrically isolated from the LDMOS transistor by the second trench.

13. The semiconductor device of claim 6, wherein the first trench extends through the semiconductor layer into the substrate, the trench gate being formed in an upper portion of the first trench, the semiconductor device further comprising:

a second trench formed in the semiconductor layer and extending into the substrate, the second trench being filled with the trench dielectric, a trench gate being formed in an upper portion of the second trench and insulated from the sidewall of the second trench by a third gate dielectric layer, the trench gate being electrically floating or electrically connected to a given potential for deactivating the trench gate in the second trench, wherein the second trench encircles active areas of the LDMOS transistor to provide electrical isolation of the LDMOS transistor.

14. The semiconductor device of claim 13, wherein the third gate dielectric layer has a thickness greater than the thickness of the first gate dielectric layer.

15. The semiconductor device of claim 13, further comprising a MOS or bipolar transistor formed in the semiconductor layer adjacent to the second trench, the MOS or bipolar transistor being electrically isolated from the LDMOS transistor by the second trench.

16. The semiconductor device of claim 1, wherein the substrate comprises a substrate of the first conductivity type and the drain electrode comprises a backside drain electrode formed on a backside of the substrate, the dual channel trench LDMOS transistor forming a vertical trench LDMOS transistor.

17. The semiconductor device of claim 16, further comprising a vertical trench MOS transistor formed in a separate region of the same substrate and the same semiconductor layer, the vertical trench MOS transistor comprising:

a fourth trench formed in the semiconductor layer, the fourth trench being filled with a trench dielectric, a fourth trench gate being formed in the fourth trench and insulated from the sidewall of the fourth trench by a fourth gate dielectric layer;

a fourth body region of the second conductivity type formed in the semiconductor layer adjacent the fourth trench, the fourth body region extending to a depth near a bottom edge of the fourth trench gate formed in the fourth trench; and a source region of the first conductivity type formed in the fourth body region and adjacent the fourth trench, the source region being formed in a top portion of the fourth body region, wherein the vertical trench MOS transistor is formed with the substrate being a drain region, the semiconductor layer being a drain drift region, and the fourth trench gate being a gate electrode of the vertical trench MOS transistor.

18. The semiconductor device of claim 1, the trench gate and planar gate are electrically connected to a gate control signal to be turned on and off in unison.

19. The semiconductor device of claim 1, the trench gate is electrically connected to a trench gate control signal and the planar gate is electrically connected to a planar gate control signal so that the trench gate and the planar gate are to be turned on and off independently of each other.

20. The semiconductor device of claim 1, wherein the first trench extends through the semiconductor layer into the substrate, the trench gate being formed in an upper portion of the first trench.

21. The semiconductor device of claim 1, wherein the semiconductor layer comprises an epitaxial layer of the first conductivity type and the semiconductor layer further comprises a buried layer of the first conductivity type formed on the substrate, the epitaxial layer being formed on the buried layer.

22. The dual channel trench LDMOS transistor of claim 1, wherein the first conductivity type is P-type conductivity and the second conductivity type is PN-type conductivity.

* * * * *